(12) United States Patent
Sipani et al.

(10) Patent No.: US 10,217,706 B2
(45) Date of Patent: *Feb. 26, 2019

(54) SEMICONDUCTOR CONSTRUCTIONS

(71) Applicant: Micron Technology, Inc., Boise, ID (US)

(72) Inventors: Vishal Sipani, Boise, ID (US); Kyle Armstrong, Meridian, ID (US); Michael D. Hyatt, Boise, ID (US); Michael Dean Van Patten, Fruitland, ID (US); David A. Kewley, Boise, ID (US); Ming-Chuan Yang, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 15/685,907

(22) Filed: Aug. 24, 2017

(65) Prior Publication Data

US 2017/0352616 A1 Dec. 7, 2017

Related U.S. Application Data

(60) Continuation of application No. 14/699,664, filed on Apr. 29, 2015, now Pat. No. 9,780,029, which is a
(Continued)

(51) Int. Cl.
*H01L 23/525* (2006.01)
*H01L 21/033* (2006.01)
(Continued)

(52) U.S. Cl.
CPC ........ *H01L 23/525* (2013.01); *H01L 21/0337* (2013.01); *H01L 21/0338* (2013.01);
(Continued)

(58) Field of Classification Search
None
See application file for complete search history.

(56) References Cited

U.S. PATENT DOCUMENTS 5,047,117 A 9/1991 Roberts
6,191,034 B1 2/2001 Klein et al.
(Continued)

*Primary Examiner* — Benjamin Sandvik
(74) *Attorney, Agent, or Firm* — Wells St. John P.S.

(57) ABSTRACT

Some embodiments include methods of forming electrically conductive lines. Photoresist features are formed over a substrate, with at least one of the photoresist features having a narrowed region. The photoresist features are trimmed, which punches through the narrowed region to form a gap. Spacers are formed along sidewalls of the photoresist features. Two of the spacers merge within the gap. The photoresist features are removed to leave a pattern comprising the spacers. The pattern is extended into the substrate to form a plurality of recesses within the substrate. Electrically conductive material is formed within the recesses to create the electrically conductive lines. Some embodiments include semiconductor constructions having a plurality of lines over a semiconductor substrate. Two of the lines are adjacent to one another and are substantially parallel to one another except in a region wherein said two of the lines merge into one another.

15 Claims, 12 Drawing Sheets

Related U.S. Application Data division of application No. 13/660,860, filed on Oct. 25, 2012, now Pat. No. 9,048,292.

(51) Int. Cl.
    *H01L 21/311*     (2006.01)
    *H01L 21/3213*     (2006.01)
    *H01L 21/768*     (2006.01)
    *H01L 23/528*     (2006.01)
    *H01L 23/532*     (2006.01)

(52) U.S. Cl.
    CPC .. *H01L 21/31144* (2013.01); *H01L 21/32139* (2013.01); *H01L 21/76816* (2013.01); *H01L 23/528* (2013.01); *H01L 23/5329* (2013.01); *H01L 23/53209* (2013.01); *H01L 23/53257* (2013.01); *H01L 23/53271* (2013.01); *H01L 2924/0002* (2013.01)

(56) References Cited

U.S. PATENT DOCUMENTS

| | | |
|---|---|---|
| 7,014,957 B1 | 3/2006 | Zarkesh-Ha et al. |
| 8,043,915 B2 | 10/2011 | Tran |
| 8,697,538 B1 | 4/2014 | Chiang |
| 8,716,135 B1 | 5/2014 | Huckabay et al. |
| 8,871,104 B2 | 10/2014 | Park et al. |
| 9,224,617 B2 | 12/2015 | Pritchard et al. |
| 9,780,029 B2 * | 10/2017 | Sipani .................. H01L 23/525 |
| 2002/0001939 A1 | 1/2002 | Kinoshita et al. |
| 2008/0085600 A1 | 4/2008 | Furukawa et al. |
| 2008/0179705 A1 | 7/2008 | Noelscher et al. |
| 2008/0296732 A1 | 12/2008 | Olson |
| 2009/0087959 A1 | 4/2009 | Ban |
| 2009/0115064 A1 | 5/2009 | Sandhu et al. |
| 2009/0130852 A1 | 5/2009 | Kewley |
| 2009/0170310 A1 | 7/2009 | Jung |
| 2009/0184422 A1 | 7/2009 | Ha et al. |
| 2010/0038256 A1 | 2/2010 | Monchoix et al. |
| 2011/0129991 A1 | 6/2011 | Armstrong et al. |
| 2012/0045901 A1 | 2/2012 | Kim et al. |
| 2012/0261831 A1 | 10/2012 | Sudo |
| 2013/0062771 A1 | 3/2013 | Kodama et al. |
| 2014/0127905 A1 | 5/2014 | Chiang |
| 2015/0214064 A1 | 7/2015 | Pritchard et al. |
| 2016/0181110 A1 | 6/2016 | Yen et al. |

* cited by examiner

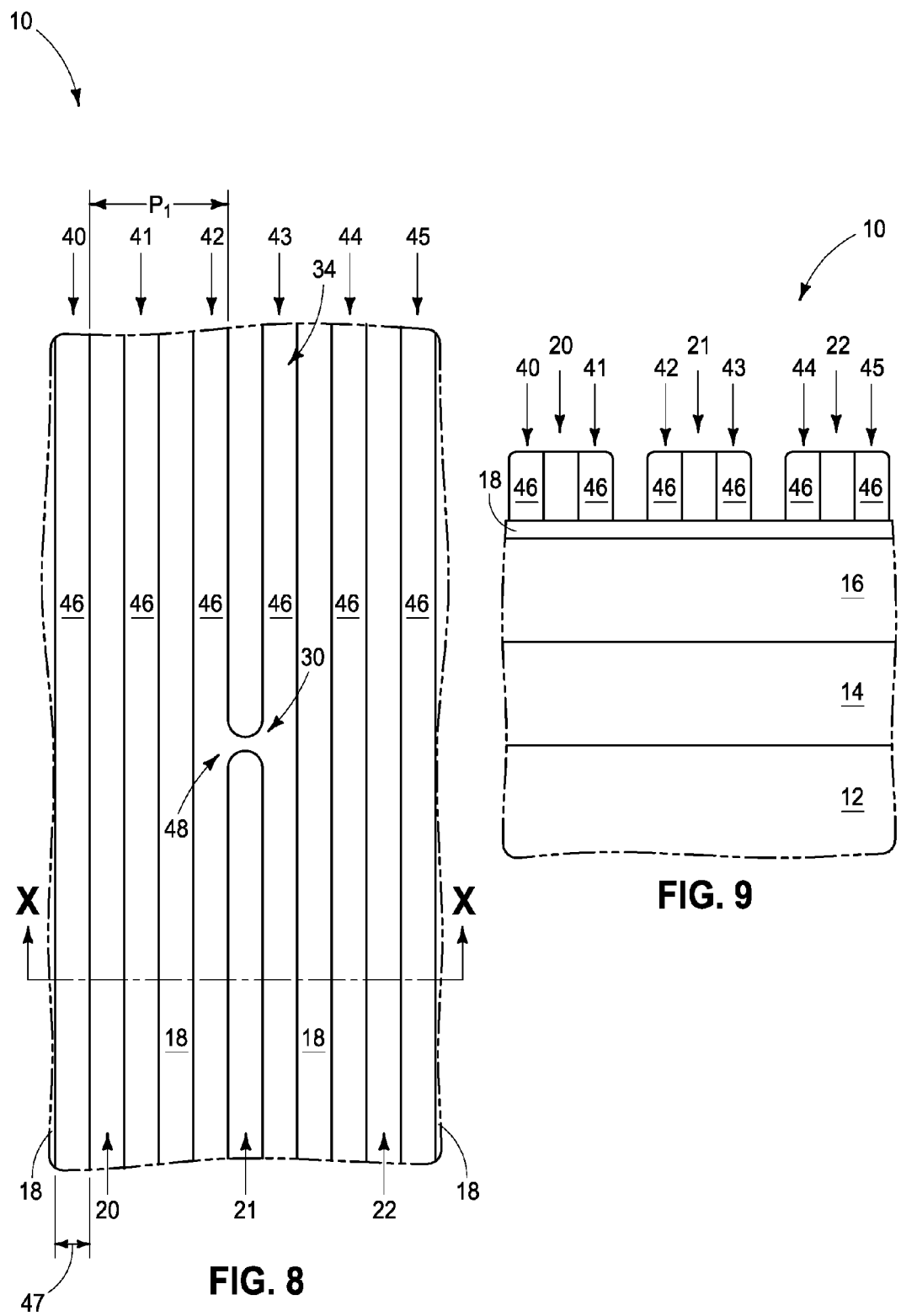

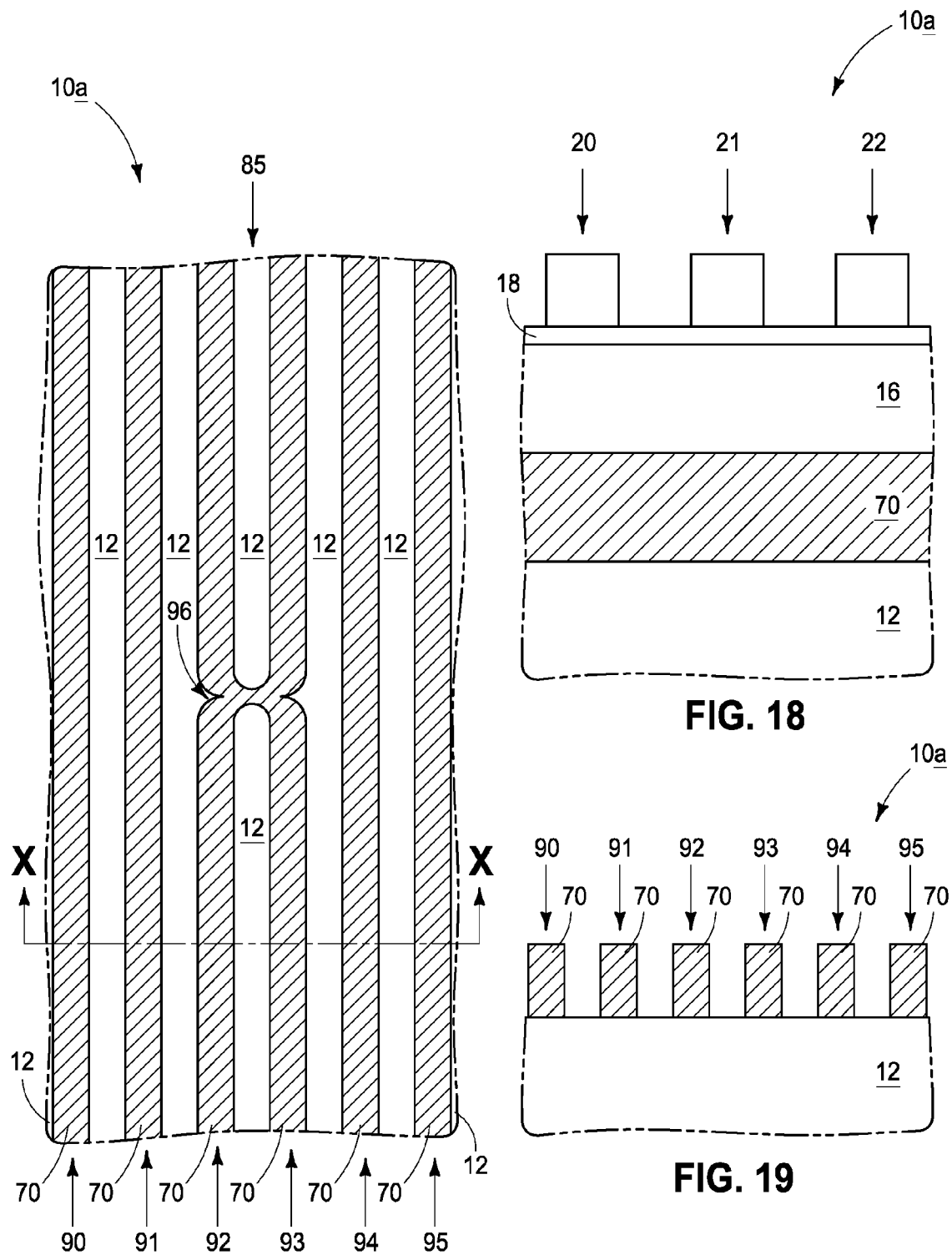

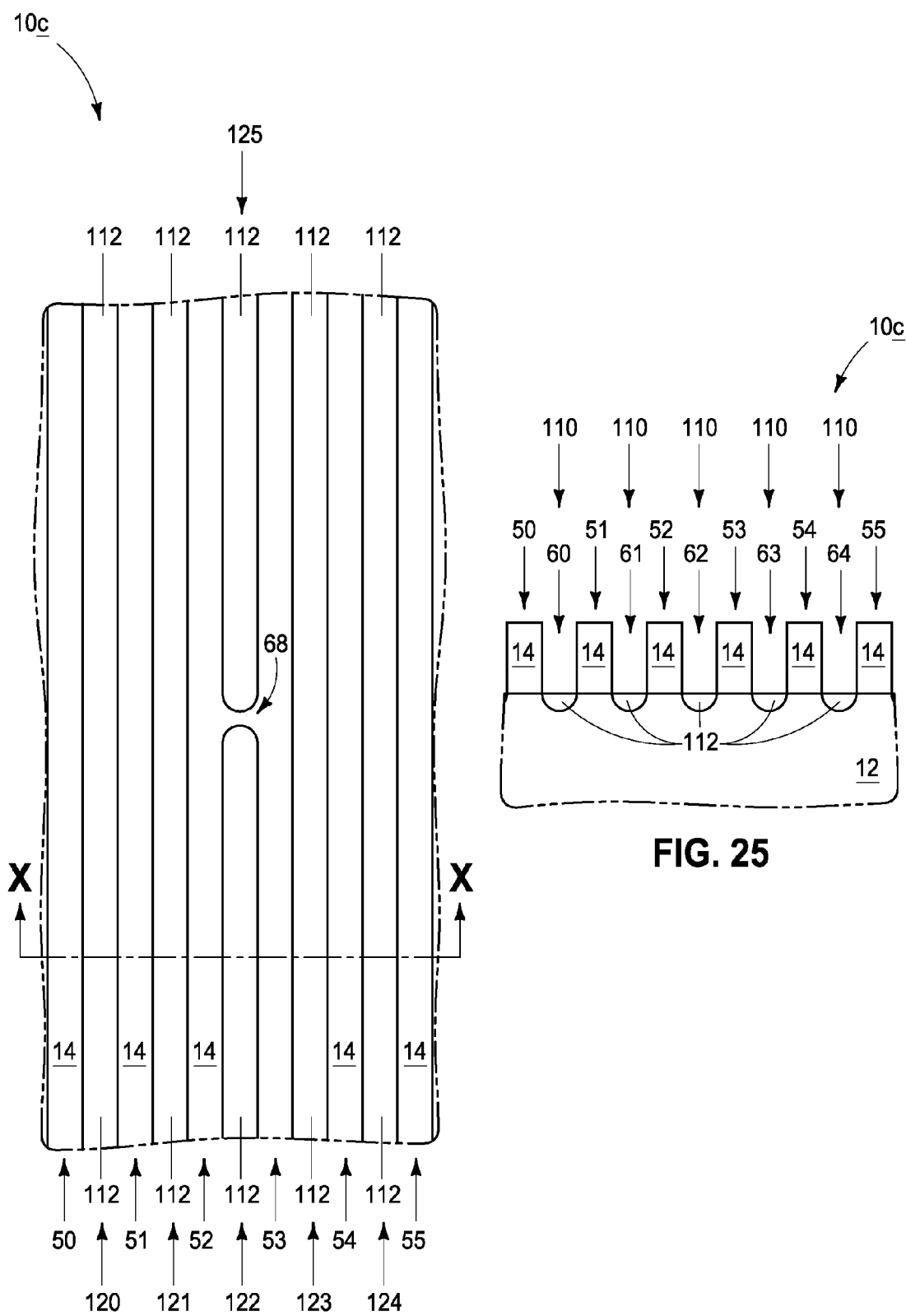

SEMICONDUCTOR CONSTRUCTIONS

RELATED PATENT DATA

This patent resulted from a continuation of U.S. patent application Ser. No. 14/699,664 which was filed Apr. 29, 2015, which is a divisional of U.S. patent application Ser. No. 13/660,860, which was filed Oct. 25, 2012, now U.S. Pat. No. 9,048,292, each of which is hereby incorporated herein by reference.

TECHNICAL FIELD

Semiconductor constructions, patterning methods, and methods of forming electrically conductive lines.

BACKGROUND

Lithographic processes, such as photolithography, are commonly utilized during semiconductor processing. Lithographic processes have minimum capable feature sizes, F, which are the smallest feature sizes that can be reasonably formed with the processes. For instance, photolithography may be limited by factors such as optics and radiation wavelength.

A continuing goal in semiconductor processing is to reduce the size of individual electronic components, and to thereby enable smaller and denser integrated circuitry. A concept commonly referred to as "pitch" can be used to quantify the density of an integrated circuit pattern. Pitch may be defined as the distance between an identical point in two neighboring features of a repeating pattern. Feature size limitations of a lithographic technique can set a minimum pitch that can be obtained from the lithographic technique.

Pitch multiplication, such as pitch-doubling, is a proposed method for extending the capabilities of lithographic techniques beyond their minimum pitches. Pitch multiplication may involve forming sublithographic features (i.e., features narrower than minimum lithographic resolution) by depositing a material to have a thickness which is less than that of the minimum capable lithographic feature size, F. The material may be anisotropically etched to form the sublithographic features. The sublithographic features may then be used for integrated circuit fabrication to create higher density circuit patterns than can be achieved with conventional lithographic processing.

Difficulties may be encountered in processing associated with formation and utilization of sublithographic features. For instance, some processing may utilize traditional photolithography for fabricating masks utilized during chopping and/or other modification of sub-photolithographic features. It can be difficult to align and utilize a photolithographic-scale structure during modification of a sub-photolithographic-scale structure.

It would be desirable to develop new methods for forming and utilizing sublithographic features. It would also be desirable to develop new structures utilizing such new methods.

BRIEF DESCRIPTION OF THE DRAWINGS

FIG. 3 is a top view of the region; and FIGS. 4 and 5 are diagrammatic cross-sectional views along the lines 4-4 and 5-5, respectively, of FIG. 3.

FIGS. 8 and 9 show a top view and a cross-sectional side view, respectively, of the construction of FIGS. 1 and 2 at an example processing stage subsequent to that of FIGS. 6 and 7. The cross-section of FIG. 9 is along the line X-X of FIG. 8.

FIG. 18 shows a cross-sectional side view of a construction analogous to that of FIGS. 1 and 2 in accordance with another example embodiment.

FIG. 19 shows the construction of FIG. 18 at an example processing stage subsequent to that of FIG. 18.

FIG. 20 shows a top view of the construction of FIG. 19; with the construction of FIG. 19 being along the line X-X of FIG. 20.

FIG. 25 shows a cross-sectional side view of the construction of FIGS. 1 and 2 at an example processing stage subsequent to that of FIGS. 10 and 11 in accordance with another example embodiment.

FIG. 26 shows a top view of the construction of FIG. 25 at a processing stage subsequent to that of FIG. 25.

DETAILED DESCRIPTION OF THE ILLUSTRATED EMBODIMENTS

Some embodiments include methods of forming patterns utilizing pitch-multiplication methodologies. Similarly to conventional pitch-multiplication processes, photoresist features are formed to lithographic scale and are then trimmed to reduce widths of the features. The trimmed features are then utilized as templates for patterning spacers formed to sublithographic scale. However, unlike conventional pitch-modification processes, the photoresist features may be formed to have modified regions configured to be removed during the trimming of the features, which produces gaps at predetermined locations within the trimmed photoresist features. The subsequently-formed spacers may merge within the gaps, and thus a sublithographic pattern formed by the spacers may have merge regions in addition to the conventional pattern formed from the spacers. The spacers and merge regions may be subsequently utilized to produce patterns over and/or within a semiconductor substrate. Example embodiment processes and structures are described below with reference to FIGS. 1-26.

Figures 1, 2:
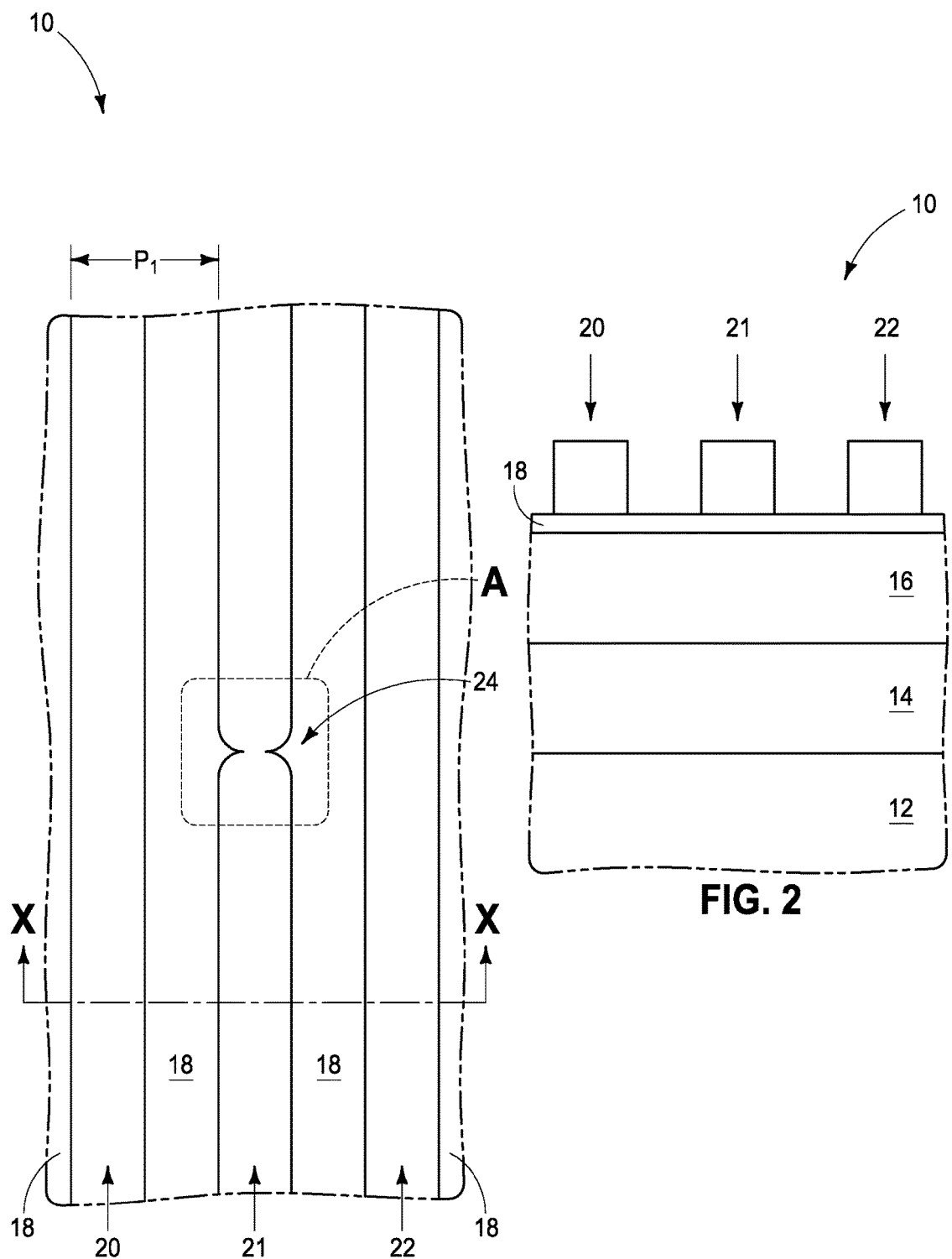
FIGS. 1 and 2 diagrammatically illustrate a top view and a cross-sectional side view, respectively, of a portion of a semiconductor construction at a processing stage of an example embodiment. The cross-section of FIG. 2 is along the line X-X of FIG. 1.

Referring to FIGS. 1 and 2, a semiconductor construction 10 is shown in top view and cross-sectional side view, with the cross-section of FIG. 2 being along the line X-X of FIG. 1. The construction includes a plurality of photoresist features 20-22 supported by a semiconductor base 12. In the shown embodiment, materials 14, 16 and 18 are over base 12, and the photoresist features 20-22 are directly on material 18.

Base 12 may comprise semiconductor material; and may, for example, comprise, consist essentially of, or consist of silicon (for instance, monocrystalline silicon). In some embodiments, base 12 and one or more of the materials thereover may be considered to correspond to a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Some of the materials may be under the shown region of base 12 and/or may be laterally adjacent the shown region of base 12; and may correspond to, for example, one or more of refractory metal materials, barrier materials, diffusion materials, insulator materials, etc.

The material 14 may be an electrically insulative material in some embodiments, and may comprise any suitable composition or combination of compositions. In some embodiments, material 14 may comprise, consist essentially of, or consist of one or both of second dioxide and second nitride.

The material 16 may comprise, consist essentially of, or consist of carbon in some embodiments.

The material 18 may comprise an antireflective material in some embodiments; and may, for example, comprise, consist essentially of, or consist of silicon oxynitride.

The photoresist features 20-22 are lines in the shown embodiment, and are on a pitch $P_1$. Such pitch may be a lithographic pitch, and may be about the minimum pitch achievable by the photolithographic process utilized to form the features 20-22. In some embodiments, $P_1$ may be within a range of from about 40 nanometers (nm) to about 500 nm.

The feature 21 has a modified region 24. Such modified region is narrowed relative to the remainder of feature 21. The modified region 24 is patterned during the photolithographic formation of photoresist features 20-22. Such modified region may be formed utilizing any suitable methodology, including, for example, utilizing a reticle having a gap in a chrome pattern to define the desired modified region 24 along the photoresist feature. Additionally, or alternatively, the reticle may comprise outriggers and/or inriggers utilized in forming the desired modified region 24. Additionally, or alternatively, optical proximity correction (OPC) may be utilized in forming the desired modified region 24. Although one modified region is shown, in other embodiments multiple modified regions may be formed. If multiple modified regions are formed, two or more of the modified regions may be along a single photoresist feature and/or at least one of the modified regions may be along a different photoresist feature than at least one other of the modified regions.

The modified region 24 ultimately forms a gap along photoresist feature 21 during a trim of the photoresist feature, as discussed below with reference to FIGS. 6 and 7. The modified region may have any suitable configuration for forming such gap. The shown modified region is symmetric about a centerline through photoresist feature 21. In other embodiments, suitable modified regions may be formed which are asymmetric about a centerline through a photoresist feature.

Figure 3:
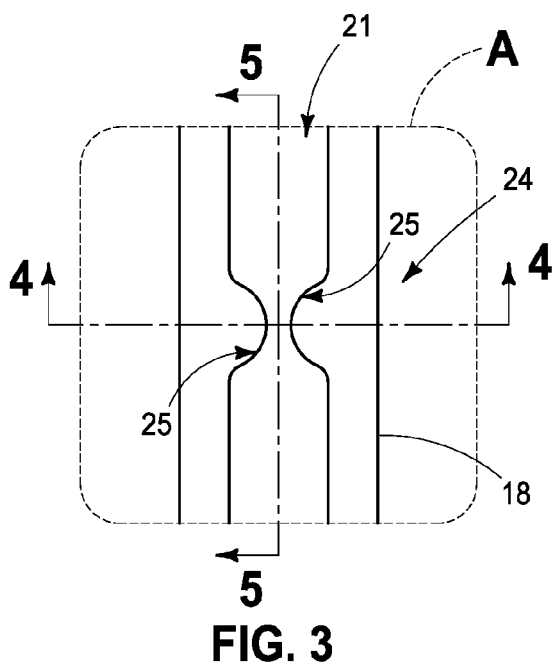
FIGS. 3-5 diagrammatically illustrate a region A of FIG. 1 in accordance with an example embodiment.
Figure 4:
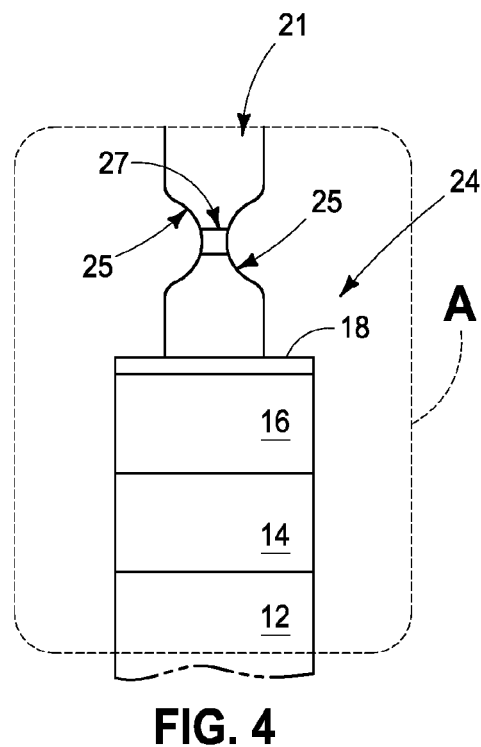
Figure 5:
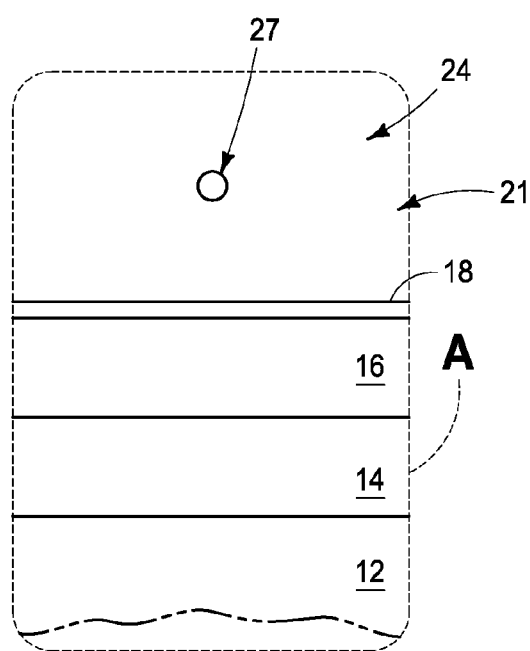

An example modified region is described with reference to FIGS. 3-5 relative to an enlarged view of the region A of FIG. 1. FIG. 3 is a top view of the modified region; and FIGS. 4 and 5 are cross-sectional views along the lines 4-4 and 5-5, respectively, of FIG. 3. The illustrated modified region comprises concave segments 25 on opposing sides of line 21, and such concave sides define a narrowed portion of the line. FIGS. 4 and 5 show an example embodiment in which an opening 27 extends through the narrowed region of photoresist feature 21. In other embodiments, such narrowed region of the photoresist feature may be solid, rather than having the illustrated opening 27 passing therethrough.

Figures 6, 7:
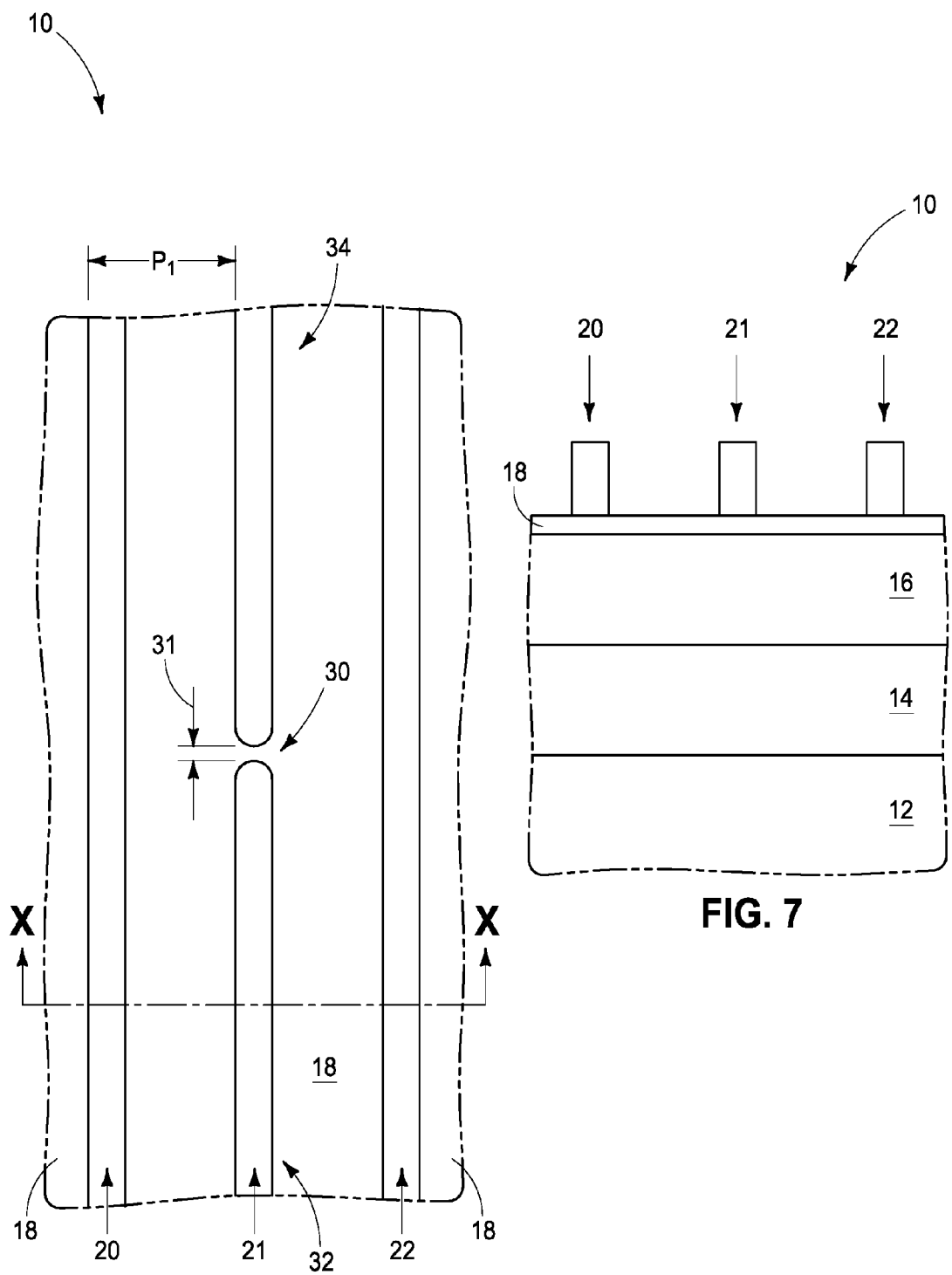
FIGS. 6 and 7 show a top view and a cross-sectional side view, respectively, of the construction of FIGS. 1 and 2 at an example processing stage subsequent to that of FIGS. 1 and 2. The cross-section of FIG. 7 is along the line X-X of FIG. 6.

Referring to FIGS. 6 and 7, the photoresist features 20-22 are trimmed to reduce widths of the features. Although the tops of the features 20-22 are shown to be unaffected by the trimming, in some embodiments the trimming conditions may decrease the heights of the features and/or may induce other changes to the features (e.g., may impose a dome-shape to the features). For instance, trimming conditions may be chosen which isotropically etch the features. The trimming may be accomplished with any suitable processing; including, for example, plasma etching with an inductively coupled reactor.

In some embodiments, the trimmed features 20-22 at the processing stage of FIGS. 6 and 7 may have sublithographic widths. In some embodiments, the initial photoresist features 20-22 formed at the processing stage of FIGS. 1 and 2 primarily have widths of at least about 40 nanometers (nm), and the trimmed features 20-22 at the processing stage of FIGS. 6 and 7 primarily have widths within a range of from about 10 nm to less than 40 nm; within a range of from about 5 nm to about 30 nm; within a range of from about 5 nm to about 20 nm; etc. The trimmed features 20-22 remain on the pitch of $P_1$ in the shown embodiment.

The trimming of feature 21 punches through the narrowed region 24 (FIG. 1) to form a gap 30. The gap 30 extends through feature 21, and divides the feature into a pair of segments 32 and 34 which are on opposing sides of the gap relative to one another. The segments 32 and 34 may be referred to as a first segment and a second segment, respectively, in some embodiments. The gap 30 comprises a dimension 31 between the segments 32 and 34. In some embodiments, such dimension may be a sublithographic dimension, and in some embodiments the dimension 31 may be a lithographic dimension. In some example embodiments, dimension 31 may be within a range of from about 10 nm to about 100 nm; within a range of from about 10 nm to about 40 nm; within a range of from about 10 nm to about 30 nm; within a range of from about 5 nm to about 20 nm; etc.

Referring to FIGS. 8 and 9, spacers 40-45 are formed along sidewalls of features 20-22. The spacers comprise a spacer material 46. Such spacer material may be any suitable composition or combination of compositions. In some example embodiments, the spacer material may be electrically insulative; and may, for example, comprise, consist essentially of, or consist of one or both of second dioxide and second nitride. In some example embodiments (such as embodiments described below with reference to FIGS. 21-24), the spacer material may be electrically conductive; and may, for example, comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.).

The spacers 40-45 may be formed by, for example, forming spacer material 46 over and between features 20-22, and subsequently anisotropically etching the spacer material.

The spacers 40-45 have widths (i.e., lateral thicknesses) 47. In some embodiments, such widths may be within a range of from about 5 nm to about 50 nm; within a range of from about 5 nm to about 20 nm; within a range of from about 2 nm to about 10 nm; etc.

The spacers are arranged in 2:1 correspondence relative to the photoresist features 20-22, with a pair of spacers being associated with each of the features 20-22. Specifically, spacers 40 and 41 are on opposing sides of feature 20 relative to one another; spacers 42 and 43 are on opposing sides of feature 21 relative to one another; and spacers 44 and 45 are on opposing sides of feature 22 relative to one another. In the shown embodiment, spacers 42 and 43 merge with one another within gap 30 to form a merged region 48 of the spacers.

Figures 10, 11:
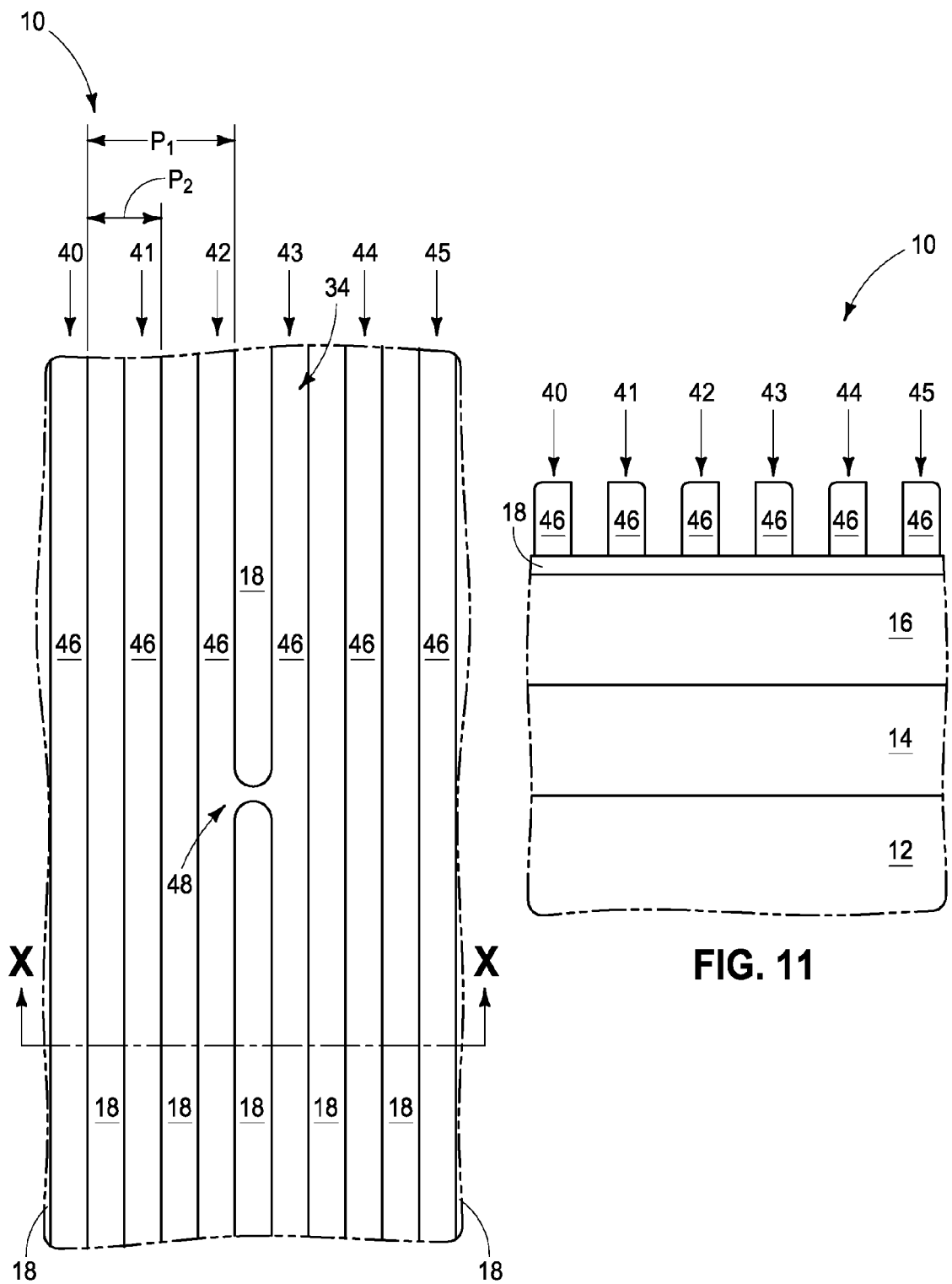
FIGS. 10 and 11 show a top view and a cross-sectional side view, respectively, of the construction of FIGS. 1 and 2 at an example processing stage subsequent to that of FIGS. 8 and 9. The cross-section of FIG. 11 is along the line X-X of FIG. 10.

Referring to FIGS. 10 and 11, the features 20-22 (FIGS. 8 and 9) are removed to leave a pattern comprising the spacers 40-45. In the shown embodiment, the spacer pattern is on a pitch $P_2$ which is about one-half of the pitch $P_1$ that the photoresist features had been initially formed on (FIGS. 1 and 2). Such may correspond to a so-called pitch-doubling process. In other embodiments, other pitch-multiplication processes may be utilized, including, for example, pitch-tripling processes, pitch-quadrupling processes, etc. The shown pattern has spacers 40-45 spaced apart from one another by spaces that are about the same width as the spacers. In other embodiments the spacers may be different widths than the spaces between them. Also, in some embodiments, some of the spacers may be of different widths than others and/or some of the spaces between the spacers may be of different widths than others of such spaces.

In the shown embodiment, the spacers 40-45 correspond to a plurality of lines which are substantially parallel to one another. The lines corresponding to spacers 40 and 41 are substantially parallel to one another across the entirety of the shown portion of construction 10, and similarly the lines corresponding to spacers 44 and 45 are substantially parallel to one another across the entirety of the shown portion of construction 10. The lines corresponding to spacers 42 and 43 are substantially parallel to one another across the entirety of the shown portion of construction 10, except in the region 48 where the lines merge into one another.

The pitch $P_2$ may be sublithographic or lithographic. In some embodiments, the pitch $P_2$ may be within a range of from about 10 nm to about 100 nm; within a range of from about 5 nm to about 40 nm; within a range of from about 5 nm to about 30 nm; etc. In some embodiments, the lines corresponding to spacers 40-45 may have widths of less than about one-half of the pitch $P_2$; and in some embodiments may have widths less than or equal to about one-fourth of the pitch $P_2$. For instance, in some example embodiments the lines corresponding to spacers 40-45 may have widths within a range of from about 5 nm to less than about 50 nm, while $P_2$ is within a range of from about 20 nm to about 100 nm; in some example embodiments the lines corresponding to spacers 40-45 may have widths within a range of from about 5 nm to less than about 25 nm, while $P_2$ is within a range of from about 20 nm to about 100 nm; etc.

Figure 12:
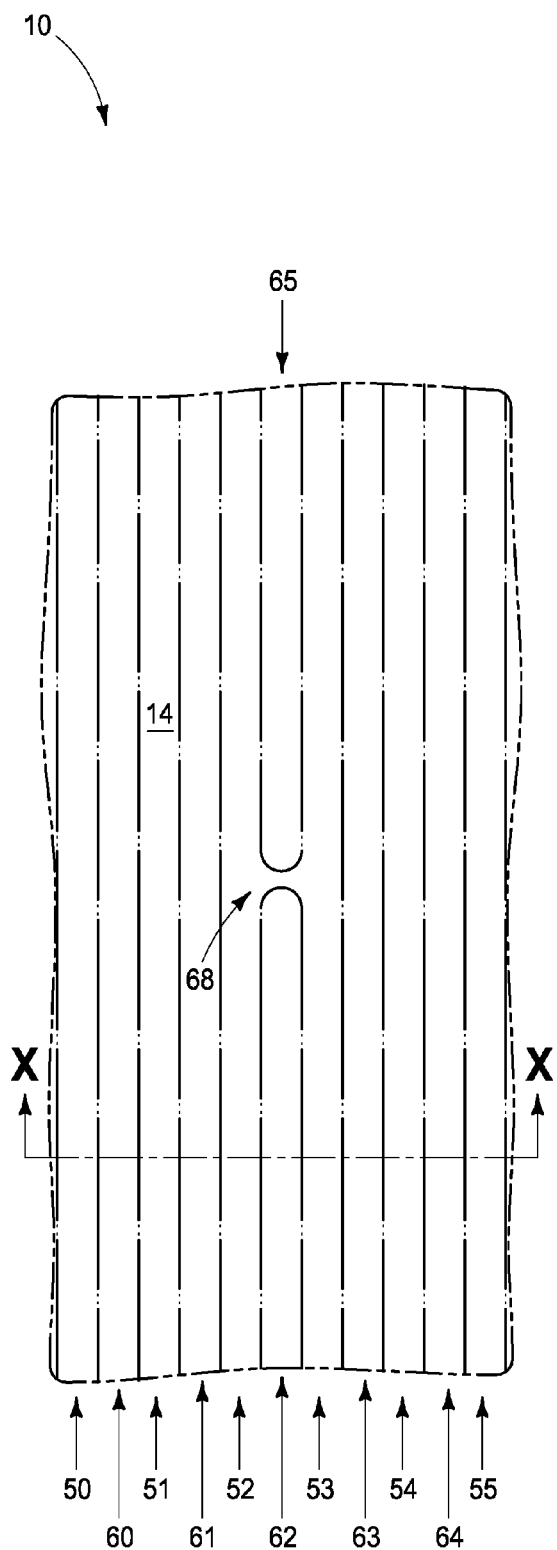
FIGS. 12 and 13 show a top view and a cross-sectional side view, respectively, of the construction of FIGS. 1 and 2 at an example processing stage subsequent to that of FIGS. 10 and 11. The cross-section of FIG. 13 is along the line X-X of FIG. 12.
Figure 13:
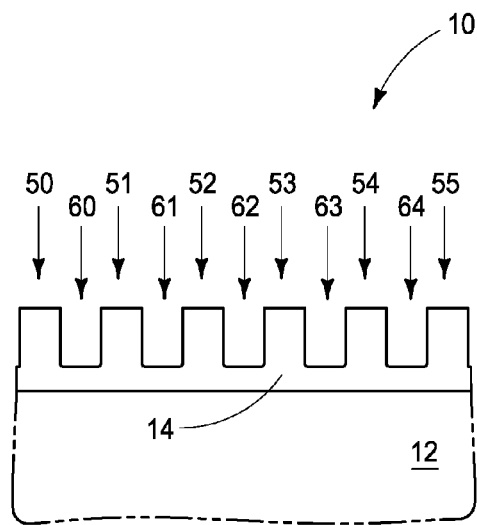

Referring to FIGS. 12 and 13, the pattern of spacers 40-45 (FIGS. 10 and 11) is transferred into material 14 to create a topology comprising peaks 50-55 and recesses 60-65. The recess 65 is visible in the top view of FIG. 12 but is not visible along the cross-section of FIG. 13. The recesses 62 and 65 are separated by a wall 68 corresponding to a pattern transferred into material 14 from merged region 48 (FIG. 10).

The pattern of spacers 40-45 (FIGS. 10 and 11) may be transferred into material 14 utilizing any suitable methodology. For instance, the spacers 40-45 may be utilized as a mask while utilizing one or more etches to transfer a pattern from the spacers 40-45 into underlying material 16 (FIG. 11). The transferring of the pattern of the spacers into the underlying material 16 may be accompanied by removal of materials 18 and 46 (FIG. 11) in some embodiments; and in other embodiments one or both of materials 18 and 46 may be removed in a processing step subsequent to the etching of material 16. The material 16 may be utilized as a hard mask during patterning of material 14, and subsequently material 16 may be removed to leave the construction shown in FIGS. 12 and 13. In the shown embodiment, the etching of material 14 has only partially etched through material 14. In other embodiments (for instance, an embodiment described below with reference to FIGS. 19 and 20; and an embodiment described below with reference to FIGS. 25 and 26), the etching of material 14 may penetrate entirely through material 14 to expose the underlying base 12.

Figure 14:
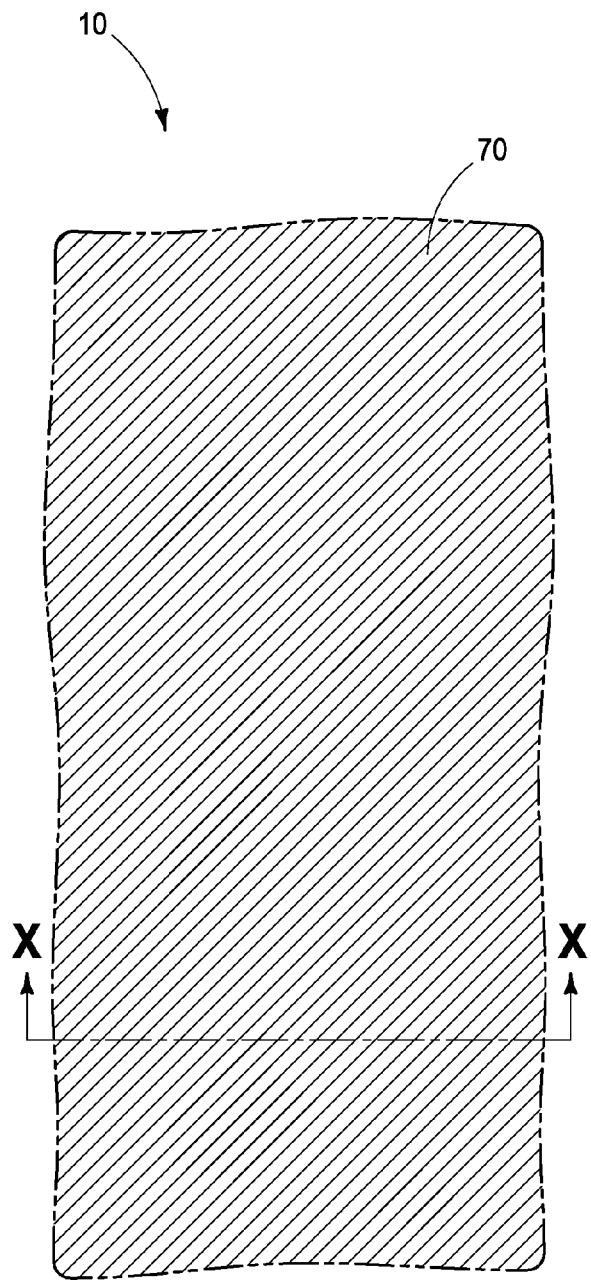
FIGS. 14 and 15 show a top view and a cross-sectional side view, respectively, of the construction of FIGS. 1 and 2 at an example processing stage subsequent to that of FIGS. 12 and 13. The cross-section of FIG. 15 is along the line X-X of FIG. 14.
Figure 15:
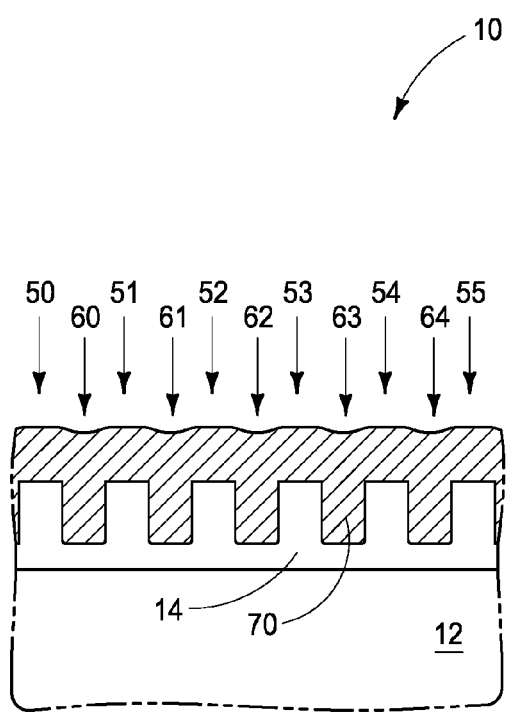

Referring to FIGS. 14 and 15, electrically conductive material 70 is formed over peaks 50-55, and within recesses 60-65 (recess 65 is visible in FIG. 12, but not FIGS. 14 and 15). In the shown embodiment, the electrically conductive material overfills the recesses. The electrically conductive material 70 may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.).

Figures 16, 17:
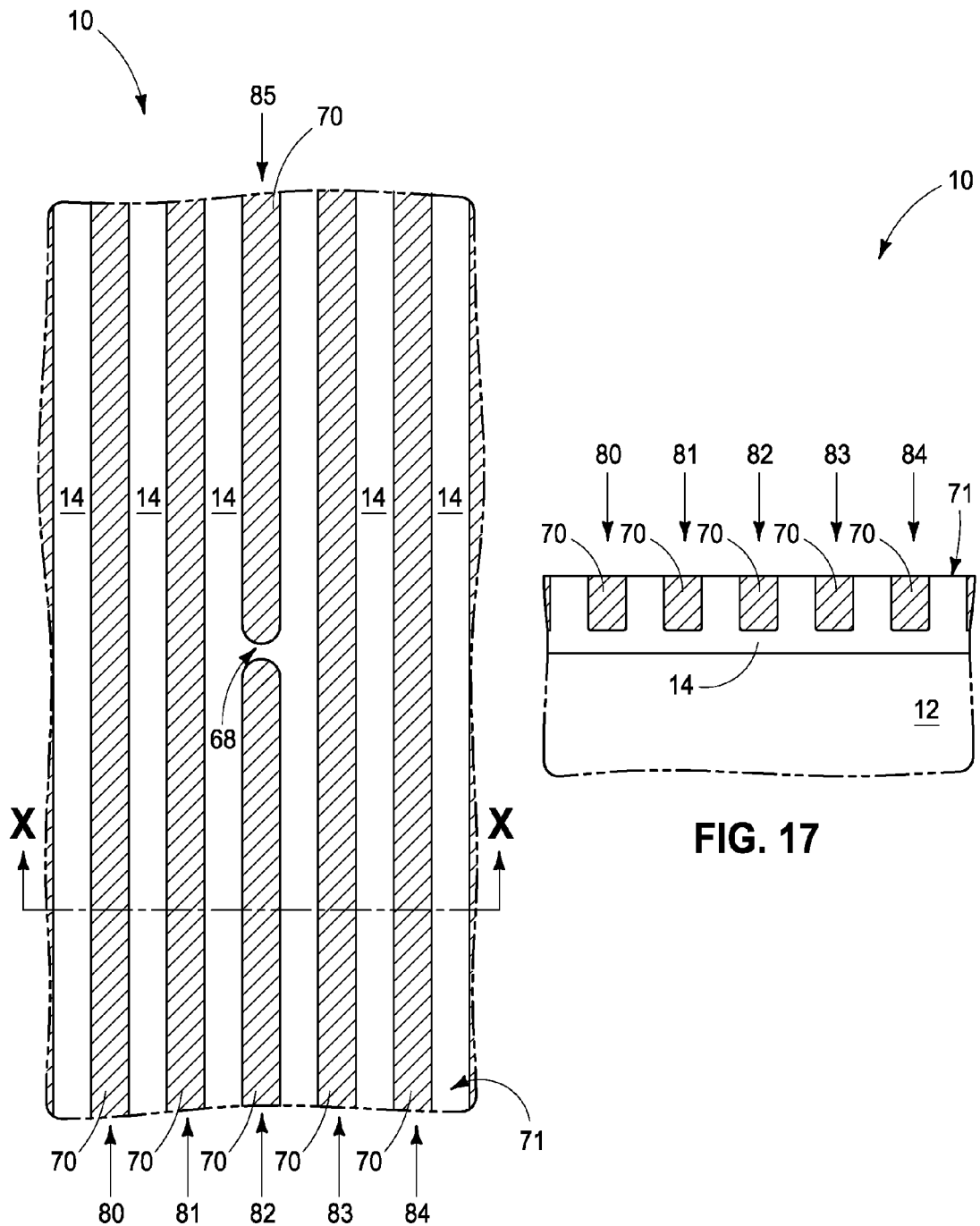
FIGS. 16 and 17 show a top view and a cross-sectional side view, respectively, of the construction of FIGS. 1 and 2 at an example processing stage subsequent to that of FIGS. 14 and 15. The cross-section of FIG. 17 is along the line X-X of FIG. 16.

Referring to FIGS. 16 and 17, construction 10 is subjected to planarization, such as, for example, chemical-mechanical polishing (CMP) to form a planarized surface 71 extending across materials 70 and 14. In other embodiments, other methods besides planarization may be utilized to remove excess material 70; with such other methods including, for example, an etch-back of material 70.

The embodiment of FIGS. 16 and 17 comprises a plurality of electrically conductive lines 80-85 formed within the recesses 60-65 (FIGS. 12 and 13), respectively. The lines 82 and 85 are separated from one another by a dielectric separator corresponding to the wall 68.

The embodiment of FIGS. 1-17 advantageously forms the dielectric separator (i.e., wall 68) between conductive lines 82 and 85 during pitch-multiplication processing, rather than utilizing an additional process step to form such dielectric separator. In contrast, utilization of conventional processing to form a structure analogous to that of FIGS. 16 and 17 may comprise an initial process sequence utilizing pitch-multiplication to form the lines 80, 81, 83 and 84, as well as to form single conductive line in place of the separate lines 82 and 85. The conventional processing may then comprise a subsequent process sequence which chops the single conductive line to form a gap through such line and thereby splits the line into the separate lines 82 and 85; followed by filling of the gap with dielectric material. The processing utilized to chop the conductive line may comprise formation of one or more lithographic-scale photoresist masking features over sublithographic-scale lines and structures analogous to the lines and structures shown at the processing stage of FIGS. 16 and 17, and it may be problematic to align such lithographic-scale features with the sublithographic-scale conductive lines and other structures, and to retain such lithographic-scale features on the sublithographic-scale lines and structures. Thus, the embodiment of FIGS. 1-17 may avoid problems and complications associated with conventional processing.

FIGS. 1-17 illustrate an example embodiment in which dielectric material 14 is patterned to form recesses which are subsequently filled with conductive material to form conductive lines. In other processing, the material 14 may be replaced with a conductive material which is directly patterned into a plurality of conductive lines. For instance, FIG. 18 shows a construction 10a analogous to the construction 10 of FIG. 2, but in which the dielectric material 14 of FIG. 2 is replaced with conductive material 70. FIG. 19 shows construction 10a at a processing stage analogous to that of FIG. 13, but in which the conductive material 70 is patterned into a plurality of electrical conductive lines 90-95. The processing utilized to fabricate the construction of FIG. 19 from that of FIG. 18 may be analogous to that of FIGS. 1-13; and specifically may utilize a modified region analogous to the region 24 of FIG. 1, and may utilized merged spacers analogous to the spacers shown in FIG. 10. For instance, FIG. 20 shows a top view of the construction 10a of FIG. 19, and shows that conductive lines 92 and 93 interconnect through a region 96 formed at a location defined by the merge region 48 of FIG. 10.

Figure 21:
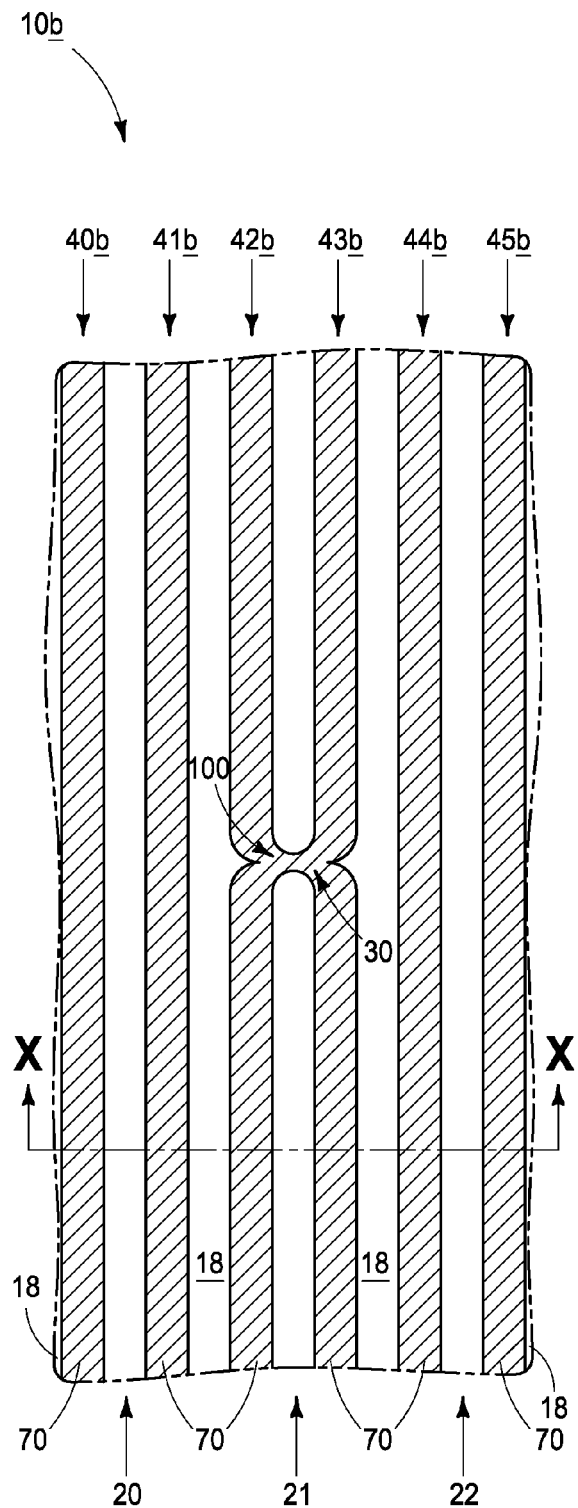
FIGS. 21 and 22 show a top view and a cross-sectional side view, respectively, of the construction of FIGS. 1 and 2 at an example processing stage subsequent to that of FIGS. 6 and 7 in accordance with another example embodiment. The cross-section of FIG. 22 is along the line X-X of FIG. 21.
Figure 22:
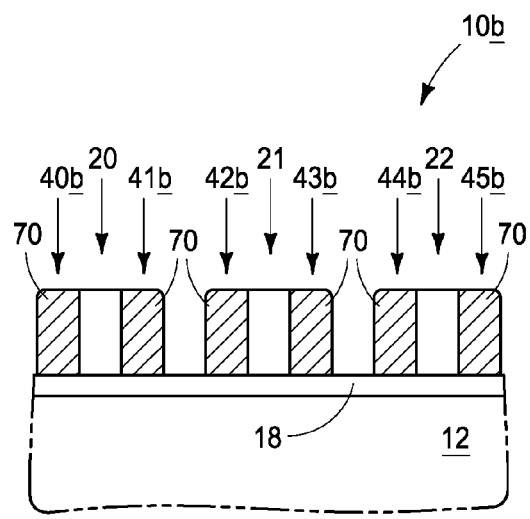
Figures 23, 24:
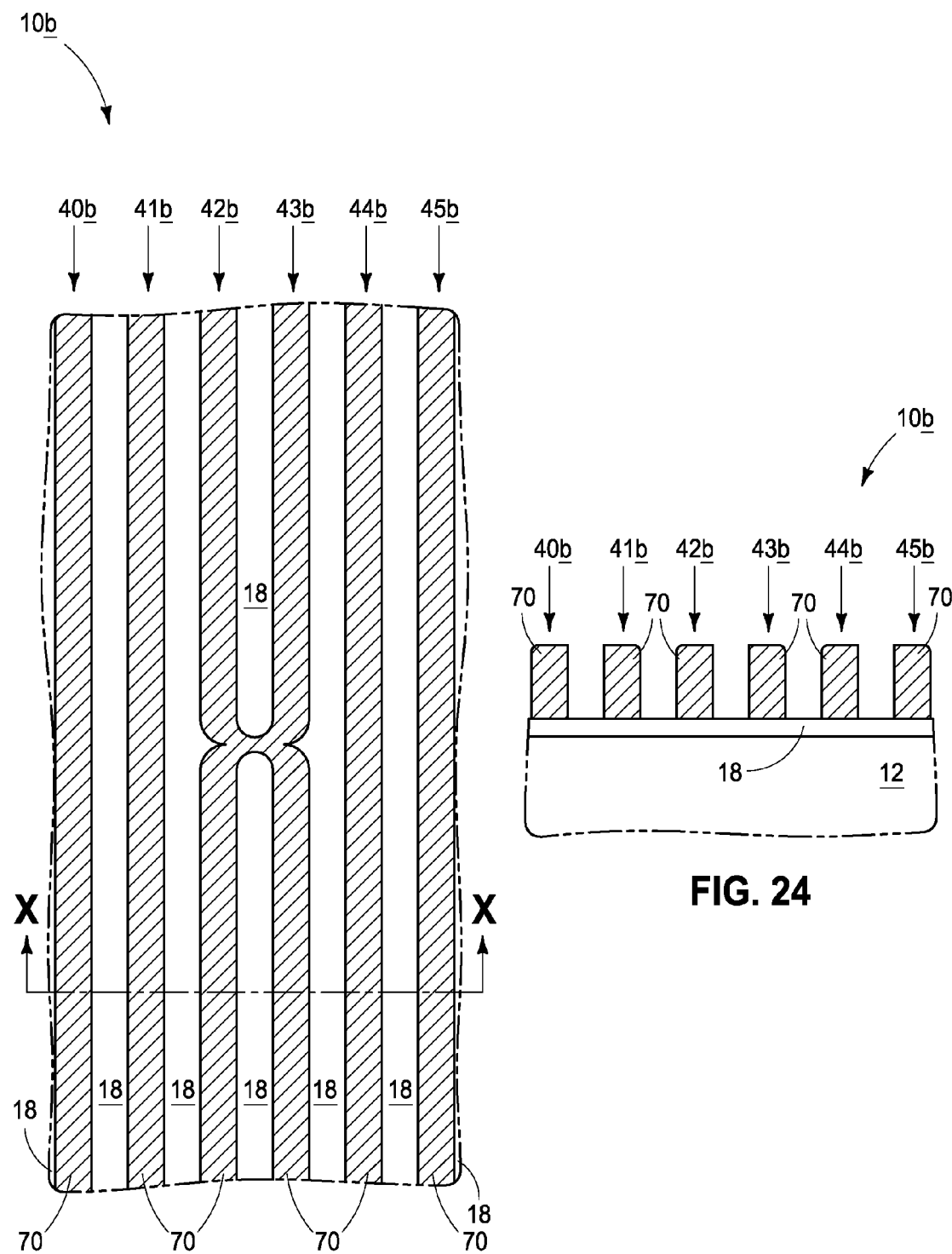
FIGS. 23 and 24 show a top view and a cross-sectional side view, respectively, of the construction of FIGS. 1 and 2 at an example processing stage subsequent to that of FIGS. 21 and 22. The cross-section of FIG. 24 is along the line X-X of FIG. 23.

As discussed above with reference to FIGS. 8 and 9, in some embodiments spacers may be formed to comprise electrically conductive material. FIGS. 21-24 illustrate an example embodiment in which conductive lines are formed utilizing spacers comprising conductive material. FIGS. 21 and 20 show a construction 10b at a processing stage analogous to that described above with reference to FIGS. 8 and 9, but in which the spacers correspond to spacers 40b-45b comprising conductive material 70. The spacers 42b and 43b merge at an interconnect location 100 within the gap 30. FIGS. 23 and 24 show the construction 10b at a processing stage after removal of photoresist features 20-22 to leave the conductive spacers 40b-45b as a plurality of conductive lines extending across semiconductor base 12.

The embodiment described above with reference to FIGS. 12-17 utilized patterned material 14 to define recesses utilized for damascene-type fabrication of conductive lines 80-85. In other embodiments, the patterned material 14 may be utilized for other processing. For instance, FIGS. 25 and 26 illustrate example processing in which patterned material 14 is utilized to define locations for a dopant implant.

Referring to FIG. 25, such shows a construction 10c at a processing stage analogous to that of FIG. 13, but in which recesses 60-64 extend entirely through material 14. Dopant 110 is implanted into base 12, while using patterned material 14 as a mask. The implanted dopant forms doped regions 112 within base 12. In some embodiments, base 12 may comprise, consist essentially of, or consist of monocrystalline silicon; and the doped regions 112 may be n-type doped or p-type doped.

FIG. 26 shows construction 10c at a processing stage subsequent to that of FIG. 25, and shows that the doped regions 112 form a plurality of conductive lines 120-125. The conductive lines 122 and 125 are spaced from one another by the wall 68 described above with reference to FIG. 12.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, a method of forming a pattern comprises forming photoresist features over a substrate, with at least one of the photoresist features being broken by a gap. Spacers are formed along sidewalls of the photoresist features. The spacers on opposing sides of said at least one of the photoresist features merge within the gap. The photoresist features are removed to leave a pattern comprising the spacers.

In some embodiments, a method of forming a pattern comprises forming photoresist features over a substrate, with at least one of the photoresist features having a narrowed region. The photoresist features are trimmed to reduce widths of the photoresist features. The trimming punches through the narrowed region to form a gap which extends through said at least one of the photoresist features. Spacers are formed along sidewalls of the photoresist features. The spacers on opposing sides of said at least one of the photoresist features merge within the gap. The photoresist features are removed to leave a pattern comprising the spacers.

In some embodiments, a method of forming electrically conductive lines comprises forming photoresist lines over a substrate, with at least one of the photoresist lines having a narrowed region. The photoresist lines are trimmed to reduce widths of the photoresist lines. The trimming punches through the narrowed region to form a gap extending through said at least one of the photoresist lines. Spacers are formed along sidewalls of the photoresist lines. The spacers on opposing sides of said at least one of the photoresist lines merge within the gap to form at least one merged region of the spacers. The photoresist lines are removed to leave a pattern comprising the spacers. The pattern is extended into the substrate with one or more etches to form a plurality of recesses within the substrate. Electrically conductive material is formed within the recesses to create electrically conductive lines. The at least one merged region translates into a dielectric region that separates a pair of the electrically conductive lines from one another.

In some embodiments, a semiconductor construction comprises a plurality of lines over a semiconductor substrate, and on a pitch within a range of from about 10 nanometers to about 100 nanometers. Two of the lines are adjacent to one another and are substantially parallel to one another except in a region wherein said two of the lines merge into one another.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction comprising a pair of adjacent electrically conductive lines, the pair of adjacent lines being substantially parallel to one another except in a region where the lines merge into one another; the pair of lines curving inward toward one another in the region where the lines merge, each of the lines being collinear on either side of the region where the lines merge.

2. The construction of claim 1, wherein the electrically conductive lines are spaced from one another by electrically insulative material.

3. The construction of claim 1, wherein the electrically conductive lines have a pitch of from 10 nm to 100 nm.

4. The construction of claim 3, wherein the electrically conductive lines have a maximum width of less than or equal to about one-fourth the pitch.

5. A semiconductor construction comprising a plurality of lines over a semiconductor substrate; two of the lines being adjacent to one another being a first line and a second line and being substantially parallel to one another along a first direction except in a region wherein said two of the lines merge into one another, the two lines curving inward toward one another in the region where the lines merge; the merge region comprising a connection portion that extends between the first line and the second line in a second direction, the connection portion having a width along the first direction that is less that a width across each of the lines in the second direction, the lines comprising a dielectric material.

6. The construction of claim 5, wherein the dielectric material comprises silicon nitride.

7. The construction of claim 5, wherein the dielectric material comprises silicon oxide.

8. The construction of claim 5, wherein the lines are spaced from one another by an electrically conductive material in regions where the lines are parallel to one another.

9. The construction of claim 8, wherein the electrically conductive material comprises metal.

10. The construction of claim 8, wherein the electrically conductive material comprises metal carbide.

11. The construction of claim 8, wherein the electrically conductive material comprises metal silicide.

12. The construction of claim 8, wherein the electrically conductive material comprises conductively-doped semiconductor material.

13. A semiconductor construction comprising a plurality of lines over a semiconductor substrate; the lines being on a pitch within a range of from about 10 nanometers to about 100 nanometers; two of the lines being adjacent to one another; one of said two of the lines being a first line and the other being a second line; the first and second lines having first and second segments, respectively; the first and second segments being substantially parallel to one another along a first direction; the first and second lines merging with one another in a region; the region where the first and second lines merge having a line connection extending between the two lines, the line connection being narrower along the first direction than a width of the lines along the first and second segments of the lines, the two lines curving inward toward one another in the region where the lines merge; the first and second lines comprising dielectric material, and being spaced from one another along the substantially parallel first and second segments by electrically conductive material.

14. The construction of claim 13, wherein the electrically conductive material has sidewall surfaces that directly contacts the dielectric material.

15. The construction of claim 13, wherein each of the two lines are co-linear along the line outside the region where the first and second lines merge.

* * * * *